United States Patent [19]
Chittipeddi

[11] Patent Number: 5,918,116
[45] Date of Patent: Jun. 29, 1999

[54] PROCESS FOR FORMING GATE OXIDES POSSESSING DIFFERENT THICKNESSES ON A SEMICONDUCTOR SUBSTRATE

[75] Inventor: Sailesh Chittipeddi, Lehigh, Pa.

[73] Assignee: Lucent Technologies Inc., Murray Hill, N.J.

[21] Appl. No.: 08/853,210

[22] Filed: May 9, 1997

Related U.S. Application Data

[63] Continuation of application No. 08/347,530, Nov. 30, 1994, abandoned.

[51] Int. Cl.$^6$ ................................................ H01L 21/8234
[52] U.S. Cl. ........................... 438/199; 438/197; 438/981
[58] Field of Search ................................... 438/199, 197, 438/142, 981

[56] References Cited

U.S. PATENT DOCUMENTS

| | | | |
|---|---|---|---|
| 3,966,501 | 6/1976 | Nomura et al. . | |
| 4,170,492 | 10/1979 | Bartlett et al. | 437/24 |
| 4,651,406 | 3/1987 | Shimizu et al. | 437/52 |
| 4,728,619 | 3/1988 | Pfiester et al. | 437/70 |
| 4,743,563 | 5/1988 | Pfiester et al. | 437/24 |
| 4,748,134 | 5/1988 | Holland et al. | 437/70 |
| 4,912,062 | 3/1990 | Verma | 437/239 |
| 4,920,076 | 4/1990 | Holland et al. | 437/24 |
| 4,957,873 | 9/1990 | Ojha et al. | 437/940 |
| 5,021,354 | 6/1991 | Pfiester | 437/940 |
| 5,043,292 | 8/1991 | Aronowitz et al. | 437/940 |
| 5,045,486 | 9/1991 | Chittipeddi et al. | 437/41 |
| 5,057,449 | 10/1991 | Lowrey et al. | 148/DIG. 163 |
| 5,244,843 | 9/1993 | Chau et al. | 437/239 |
| 5,266,849 | 11/1993 | Kitahara et al. | 307/475 |
| 5,296,386 | 3/1994 | Aronowitz | 437/24 |
| 5,304,872 | 4/1994 | Avraham et al. | 307/475 |

(List continued on next page.)

FOREIGN PATENT DOCUMENTS

| | | | |
|---|---|---|---|
| 2941653 | 4/1981 | Germany . | |
| 242905A1 | 2/1987 | Germany | 437/979 |
| 54-123878 | 9/1979 | Japan | 437/45 |
| 59-104140 | 6/1984 | Japan | 437/940 |
| 1-122167 | 5/1989 | Japan . | |
| 2-237037 | 9/1990 | Japan | 437/58 |
| 4-85868 | 3/1992 | Japan . | |
| 5-275640 | 10/1993 | Japan . | |
| 6-53492 | 2/1994 | Japan . | |

OTHER PUBLICATIONS

Translation of DDR 242905 (Rost et al.).
O. W. Holland et al., Appl. Phys. Lett. 51(7) (1987) 520 "Novel Oxidation process in Ge$^+$–implanted Si . . . ".
S. Wolf + R. N. Tauber "Silicon Proc. for VLSI Era" vol. I, pp. 198–201, 290–291, 294–308, 323, 327 (1986).
S. Wolf, "Silicon Proc. for the VLSI Era" vol. II, pp. 27, 373, 382, (1992).
P. J. Wright, et al., "IEEE Trans. on Electron Dev.", 36, 5 (1989)879 "F in SiO$_2$ Gate Dielectrics" (Abstract).
N. Kasai, et al., "IEEE Trans. on Electron Dev." (Abstract) 37,6 (1990) 1426 ". . . F incorporated n–MOSFETS".

(List continued on next page.)

*Primary Examiner*—Charles Bowers
*Assistant Examiner*—Martin Sulsky
*Attorney, Agent, or Firm*—Anthony Grillo

[57] ABSTRACT

Gate oxides having different thicknesses are grown on a semiconductor layer by the process which comprises forming a semiconductor layer on a substrate, growing an oxide layer on the semiconductor layer, exposing a selected area of the oxide layer, amorphizing the semiconductor layer underlying the exposed oxide layer, removing the oxide layer to expose the semiconductor layer having both amorphized and non-amorphized regions and growing gate oxide on the amorphized and non-amorphized regions of the semiconductor layer. Gate oxide grown on the amorphized regions will be thicker than gate oxide grown on the non-amorphized regions.

The process of the invention obviates the need for special integrated circuit manufacturing design modifications and can be utilized to fabricate a wide variety of devices, in particular, MOS-type devices.

25 Claims, 6 Drawing Sheets

U.S. PATENT DOCUMENTS

| | | |
|---|---|---|
| 5,316,981 | 5/1994 | Gardner et al. ............................. 437/70 |
| 5,328,866 | 7/1994 | Chang et al. ............................. 437/235 |
| 5,330,920 | 7/1994 | Soleimani ................................. 437/24 |
| 5,358,894 | 10/1994 | Fazan et al. ................... 148/DIG. 163 |
| 5,372,952 | 12/1994 | Aronowitz et al. ........................ 437/24 |
| 5,432,114 | 7/1995 | O .............................................. 437/57 |
| 5,480,828 | 1/1996 | Hsu et al. ................................. 437/24 |
| 5,576,226 | 11/1996 | Hwang ...................................... 437/24 |

OTHER PUBLICATIONS

J.C. Hsieh, et al., "IEEE Electron Dev. Lett", 14, 5 (1993)222 "... $BF_2$ 2 or B implanted Polysi Gate W.+ W/O POCL3 ...".

G. Greeuw et al., "Solid St. Electronics" 26,3(1983)241 "Donor Generation in Mono–Si by Halogen Implantation".

S. Wolf, "Silicon Processing for the VLSi Era", vol. II, pp. 385–389, Jun. 1990.

Translation of JP 6–53492, Feb. 1994.

EPO Search Report EP 95308353.2.

D.J. Roth et al., "Silicon Interstitial Absorption During Thermal Oxidation at 900° C By Extended Defects Formed Via Silicon Implantation", Applied Physics Letters, vol. 62, No. 20, May 17, 1993, pp. 2498–2500.

D.B. Slater, Jr. et al., "Fabrication of High Quality Capacitors By Impurity Enhanced Oxidation", Journal of the Electrochemical Society, vol. 135, No. 12, Dec. 1988, pp. 3098–3103.

D.B. Slater, Jr. et al., "Low–Voltage Coefficient Capacitors for VLSI Processors", IEEE Journal of Solid–State Circuits, vol. 24, No. 1, Feb. 1989, pp. 165–173.

X.–W. Wang et al., "Pre–Oxidation Fluorine Implantation into Si", Journal of the Electrochemical Society, vol. 139, No. 1, Jan. 1, 1992, pp. 238–241.

David B. Slater Jr. and John J. Paulos, Low Voltage Coefficient Capacitors for VLSI Processes, IEEE Journal Solid State Circuits, vol. 24, No. 1, pp. 165–173, Feb. 1989.

David B. Slater Jr. and John J. Paulos, Fabrication of High Quality Capacitors by Impurtity Enhanced Oxidation, Journal of the Electrochemical Society, vol. 135, No. 12, pp. 3098–3103, Dec. 1988.

PROCESS FOR FORMING GATE OXIDES POSSESSING DIFFERENT THICKNESSES ON A SEMICONDUCTOR SUBSTRATE

This is a continuation of application Ser. No. 08/347,530 filed on Nov. 30, 1994 now abandoned.

TECHNICAL FIELD

This invention relates to a process for forming gate oxides having different thicknesses on a semiconductor substrate.

BACKGROUND OF THE INVENTION

Recent improvements in Complementary Metal Oxide Semiconductor (CMOS) technology have resulted in extremely narrow channel transistor devices having lengths of 0.5 µm and less. One advantage of these narrow devices is their ability to be densely packed on integrated circuits. As circuit designers have exploited this density feature, integrated circuit power consumption has increasingly become an important design issue. One technique for lowering system power consumption has been to reduce integrated circuit power supply voltages from a typical 5 Volts (V), to voltages in the range of from about 1.8 to about 3.3 V. A CMOS integrated circuit designed for use in low voltage systems requires thin gate-oxide transistors in order to maintain high overall device performance.

The problem created by thin gate oxide devices is that they are difficult to use in combination with higher voltage devices in the same system since the power supplies and device output swings employed in the older devices can easily damage the fragile oxide layers of the new thin gate oxide devices. A common approach to combining thin and thick gate oxide technologies has been to mix the different devices on a single integrated circuit or chip using special I/O buffers such that the internal and external clocks perform at different voltages. Customized manufacturing processes are expensive and are available to produce only a limited variety of devices.

One commonly employed method for fabricating gate oxides of varying thicknesses on a single chip is depicted in FIG. 1. As shown in FIG. 1A, first gate oxide layer 12 is grown on epitaxial silicon layer 10. Thereafter, first polysilicon layer 14 is blanket deposited on first gate oxide layer 12 as illustrated in FIG. 1B. Then, as further shown in FIG. 1B, patterned resist 16 is formed on first polysilicon layer 14. First polysilicon layer is then anisotropically etched using patterned resist 16 as a mask. Patterned resist 16 is stripped to provide first gate stack generally indicated at 17 in FIG. 1C. Second gate oxide layer 18 is then deposited/grown and second polysilicon layer 20 is then deposited as illustrated in FIG. 1D. Then, as illustrated in FIG. 1E, patterned resist 22 is formed on second polysilicon layer 20. Second polysilicon layer 20 and second gate oxide layer 18 are then anisotropically etched using patterned resist 22 as a mask. Thereafter, as illustrated in FIG. 1F, patterned resist 22 is stripped to provide second gate stack generally indicated at 24 having a gate oxide which is thicker than the gate oxide of first gate stack 17. It is readily apparent that multiple steps are involved in the formation of variable thickness gate oxides on a single wafer or chip.

SUMMARY OF THE INVENTION

In accordance with the present invention, a process for forming gate oxides possessing different thicknesses on a semiconductor layer is provided. The process of the invention involves growing a semiconductor layer upon a substrate, growing an oxide layer upon the semiconductor layer, exposing a selected area of the oxide layer, amorphizing the semiconductor layer underlying the exposed area of the oxide layer, stripping the oxide layer and growing gate oxide on the semiconductor layer. Gate oxide will grow differentially thicker on the amorphized regions of the semiconductor layer relative to the non-amorphized regions of the semiconductor layer. A wide variety of dual voltage, mixed signal, pure analog and digital devices can thereafter be formed on the semiconductor layer utilizing techniques which are well known in the art of semiconductor/integrated circuit device manufacture.

The process of this invention obviates the need to make specialized and expensive design modifications throughout the course of device manufacturing operations wherein gate oxides of different thicknesses are produced.

The phrase "semiconductor layer" as utilized herein shall be understood to refer to materials which are uniformly or selectively grown on a substrate by a crystal growth technique. Such materials include epitaxial silicon, polycrystalline silicon (polysilicon) and silicon-germanium. Suitable crystal growth techniques include chemical vapor deposition, molecular beam epitaxy, reactive magnetron sputtering, and the like.

DETAILED DESCRIPTION OF THE PREFERRED EMBODIMENTS

The process of the present invention is described in the context of forming gate oxides of different thicknesses on a single semiconductor layer by way of example only. It will be apparent to one skilled in the art that the present invention is not limited to the specific embodiments of FIGS. 2–8.

Figure 1A:
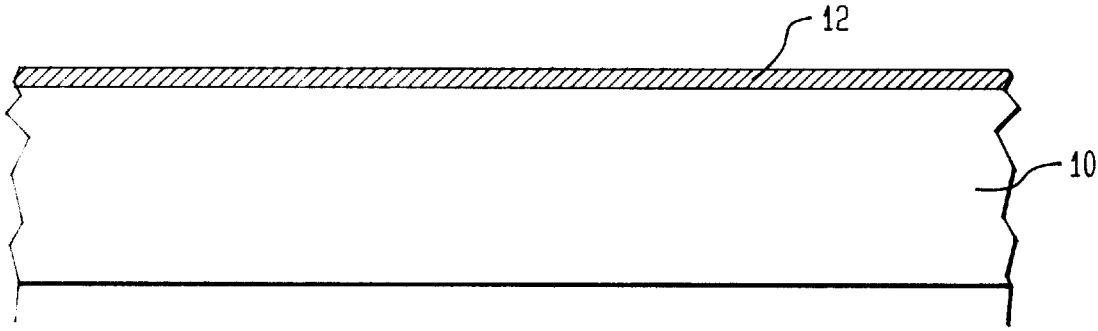
FIGS. 1(a)–(f) are diagrammatic cross-sectional views showing successive stages of a prior art method of producing different gate oxide layer thicknesses on a single semiconductor layer.
Figure 1B:
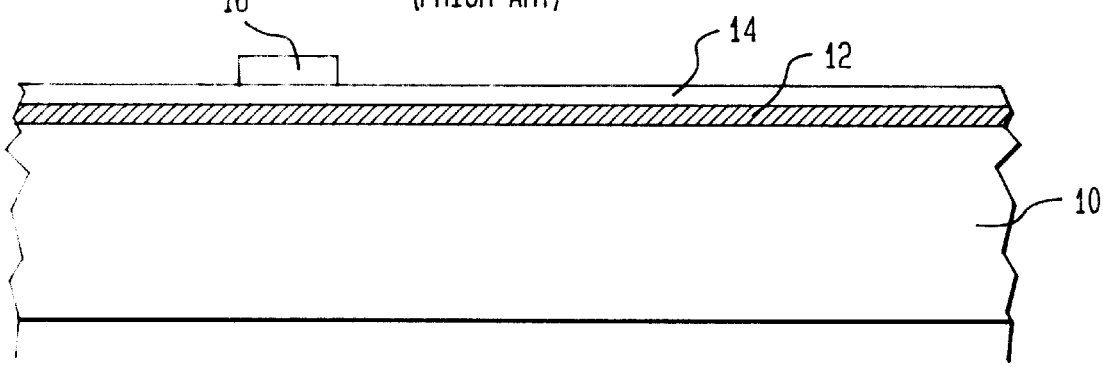
Figure 1C:
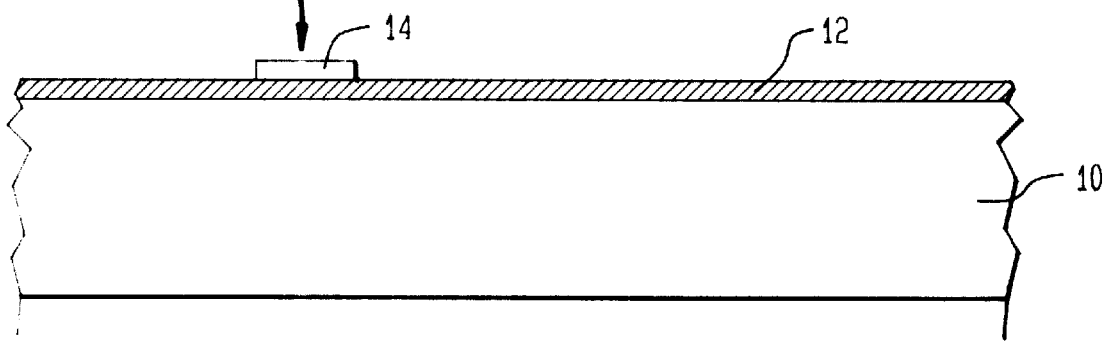
Figure 1D:
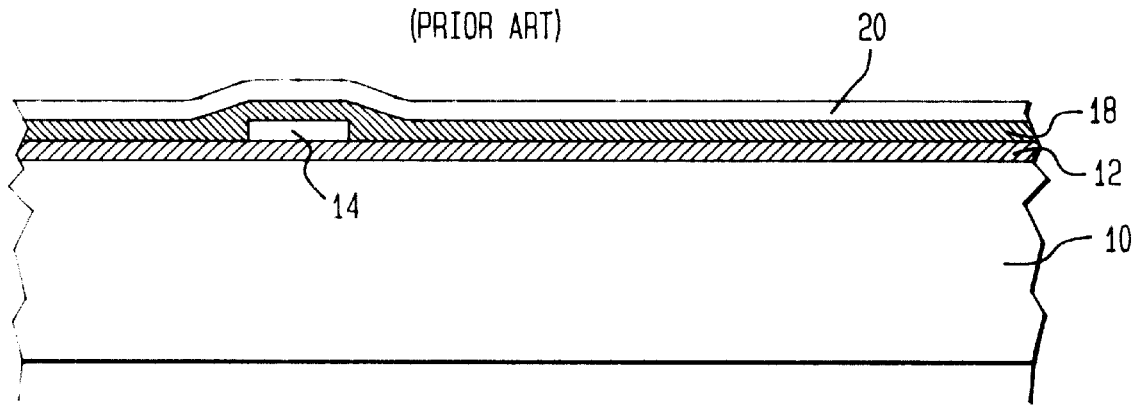
Figure 1E:
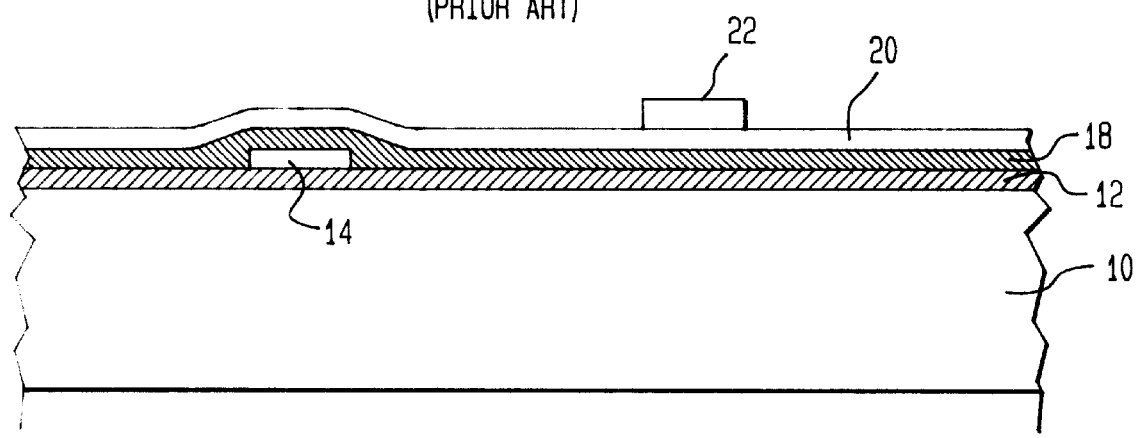
Figure 1F:
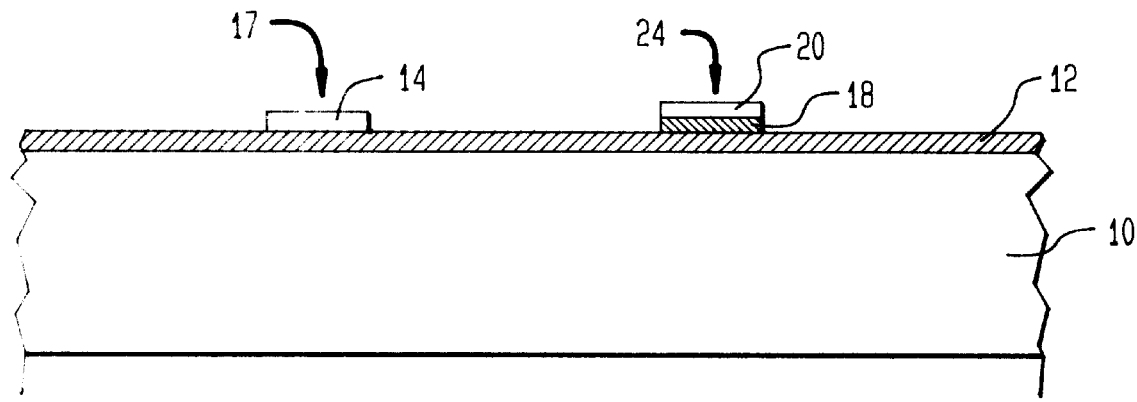
Figure 2:
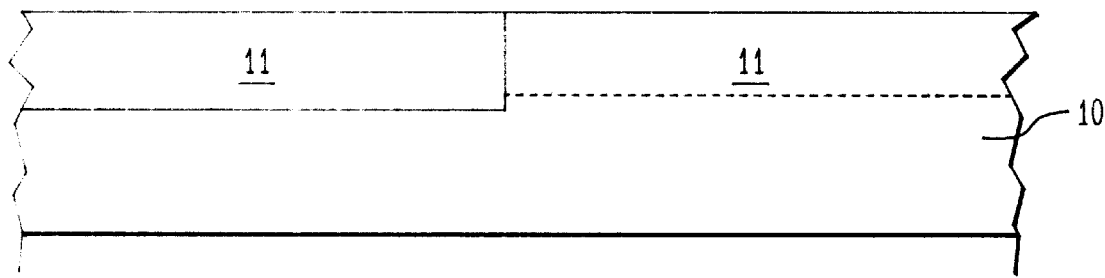
FIGS. 2–7 are diagrammatical cross-sectional views showing successive stages of the process of this invention; and, FIGS. 8(a)–(e) are transmission electron micrographs (TEMS) of cross-sections of oxide layers grown on epitaxial silicon layers.

Referring now to the drawings, FIG. 2 shows a semiconductor layer 10 which is preferably composed of epitaxial silicon. Semiconductor layer 10 shall hereinafter be referred to as epitaxial silicon layer 10. Epitaxial silicon layer 10 is typically grown on a silicon wafer substrate utilizing well known crystal growth techniques, e.g., chemical vapor deposition. Epitaxial silicon layer 10 can contain a plurality of device tubs 11 formed by ion implanting dopants such as boron, phosphorus, arsenic, etc., in selected regions of epitaxial silicon layer 10 and thereafter annealing to electrically activate the dopants. Prior to or after formation of the device tubs, a sacrificial thermal oxide layer (not shown), typically about 150 Å thick, can optionally be grown on epitaxial silicon layer 10 to remove any defects from epitaxial silicon layer 10. This sacrificial thermal oxide layer may be grown by various processes known to those skilled in the art, e.g., chemical vapor deposition (CVD). In a typical process, the sacrificial thermal oxide layer is grown by heating epitaxial silicon layer 10 to a temperature ranging from about 600° C. to about 1200° C. and then subjecting the substrate to oxidation. The sacrificial thermal oxide layer is completely etched back using, for example, a 10:1 HF etch.

Figure 3:
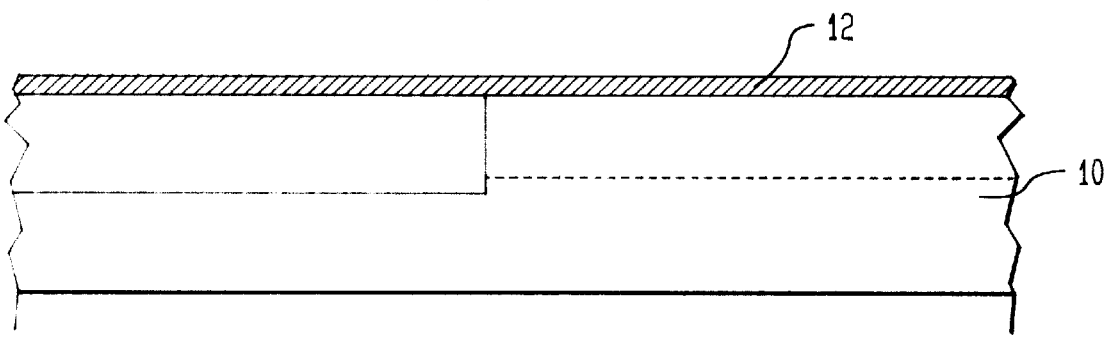

Oxide layer 12 is then preferably grown on epitaxial silicon layer 10 as illustrated in FIG. 3. The thickness of oxide layer 12 can vary from about 60 to about 500 Å, preferably from about 80 to about 200 Å. Oxide layer 12 can be formed on epitaxial silicon layer 10 by various processes known to those skilled in the art, such as by heating the substrate to a temperature ranging from about 600 to about 1200° C., preferably from about 700 to about 900° C., and subjecting the substrate to oxidation, e.g., wet or dry $O_2$.

Figure 4:
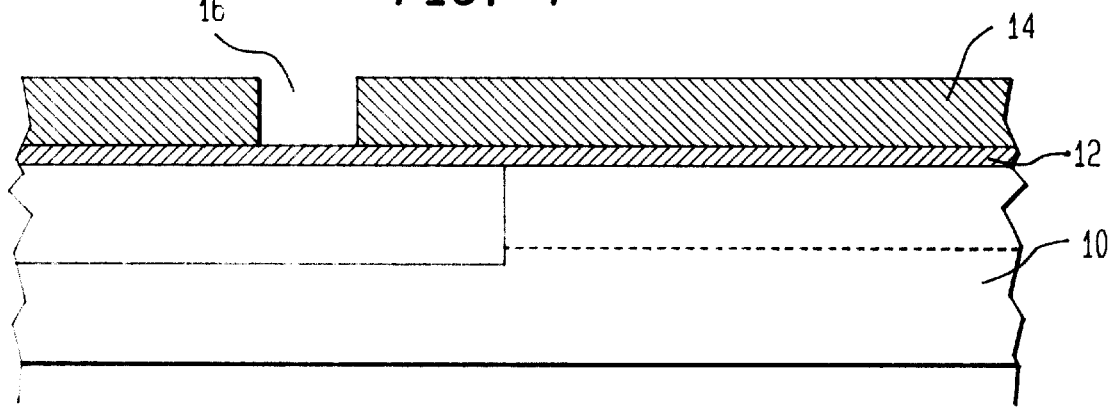

Referring to FIG. 4, a selected area of oxide layer 12 is exposed in accordance with this invention by depositing masking layer 14 on oxide layer 12. Masking layer 14 is patterned to provide window 16 which exposes a selected area of first oxide layer 12. Masking layer 14 typically comprises a resist material or any other material known to be suitable as a masking material.

Figure 5:
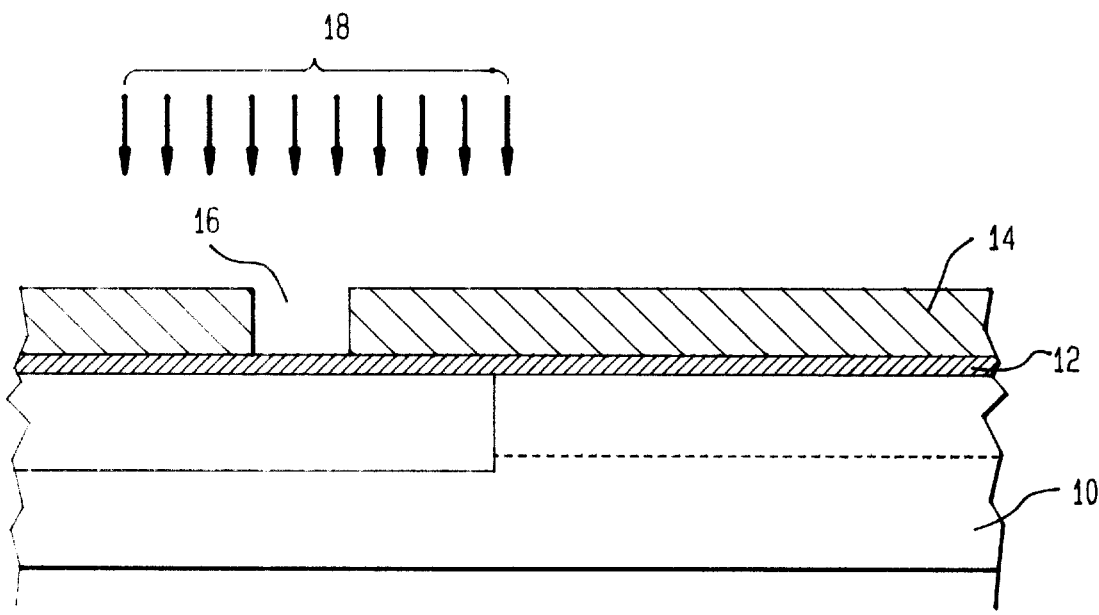
Figure 6:
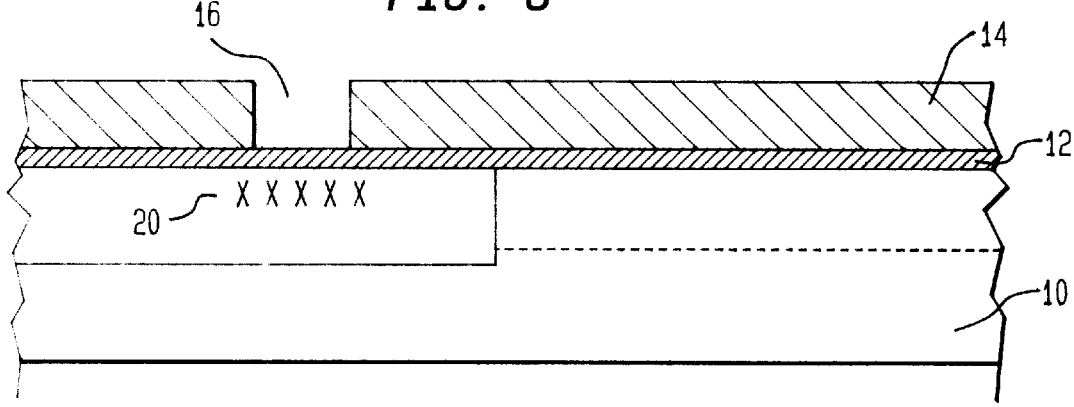

Turning now to FIG. 5, ions 18 are implanted by implantation means (not shown) such that ions 18 pass through window 16 and penetrate the exposed area of oxide layer 12 and epitaxial silicon layer 10 underlying the exposed area of oxide layer 12. Implantation of ions 18 in epitaxial silicon layer 10 damages, i.e., amorphizes, the crystal lattice structure of epitaxial silicon layer 10. FIG. 6 depicts amorphized region 20 where ions 18 are implanted in a selected region of epitaxial silicon layer 10. Oxide layer 12 partly serves the function of preventing excess damage to epitaxial silicon layer 10 from occurring when ions 18 are implanted in epitaxial silicon layer 10. Ions 18 are selected for their ability to amorphize epitaxial silicon layer 10. Such ions include silicon, fluorine, arsenic, and mixtures thereof. Silicon is preferred.

Ions 18 can be implanted via any suitable technique, preferably via ion mixing implantation, at doses typically ranging from about $1\times10^{12}$ to about $5\times10^{16}$, preferably from about $1\times10^{15}$ to about $5\times10^{15}$, ions per $cm^2$ and energies typically ranging from about 5 to about 500, preferably from about 20 to about 50, keV. Ion mixing implantation typically involves implanting ions into a substrate either in the presence or absence of an intermediate layer to amorphize the surface of the substrate. The dosage and/or energy of such an amorphizing implant will vary depending upon the thickness of exposed oxide layer 12 and the amount of damage to epitaxial silicon layer 10 which is desired. The amount of damage to epitaxial silicon layer 10 can be determined, of course, by controlling the dosage and energy of the amorphizing implant. Appropriate dosages and energies of amorphizing implants carried out in accordance with this invention can therefore be determined by routine experimentation.

After amorphization of selected regions of epitaxial silicon layer 10 is complete, masking layer 14 is removed, e.g., by dry or wet etch. In an alternative embodiment herein, thermal annealing can be employed to repair part of the damage caused by the amorphizing implant. Typically, thermal annealing can be carried out at a temperature ranging from about 600 to about 1200° C., preferably from about 750 to about 900° C., for between about 0.1 to about 120 minutes, preferably between about 60 to about 90 minutes. Following such an annealing step, oxide layer 12 is removed by any suitable method, e.g., chemical etching, utilizing known and conventional techniques, e.g., a 10:1 HF solution.

Figure 7:
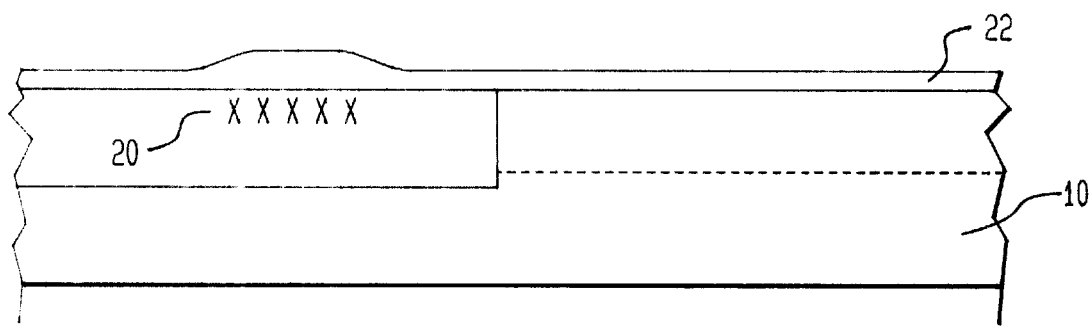
Figure 8A:
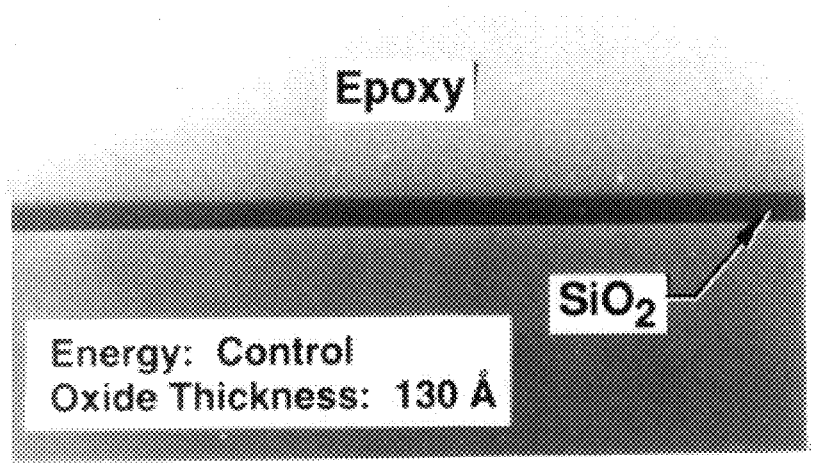
Figure 8B:
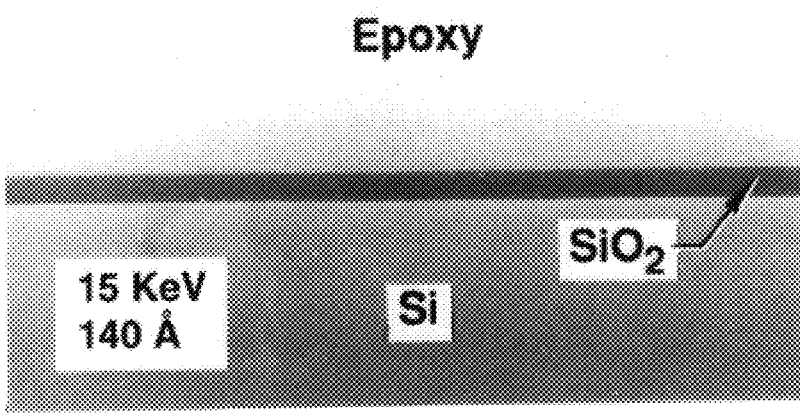
Figure 8C:
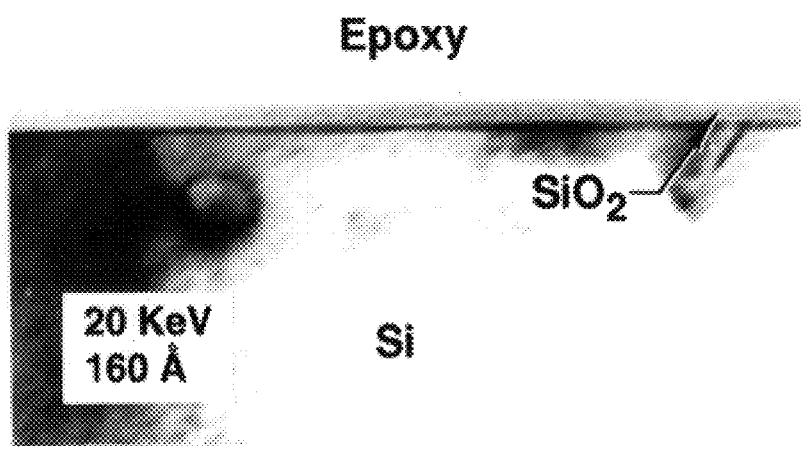
Figure 8D:
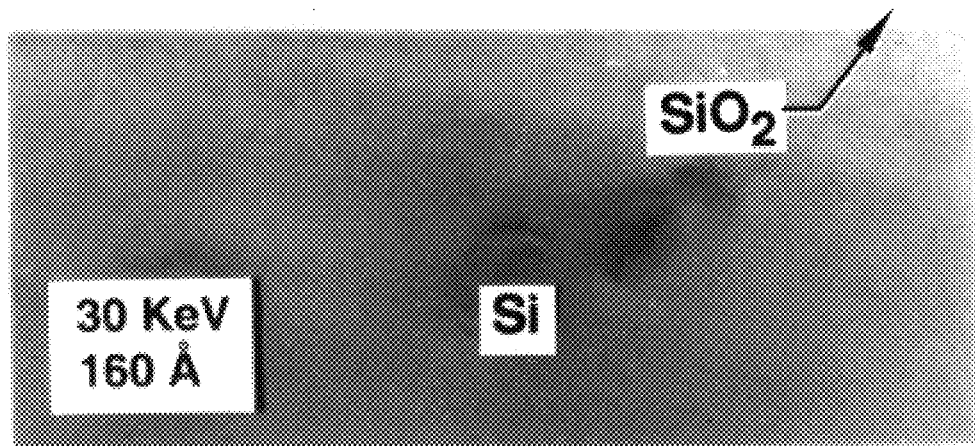
Figure 8E:
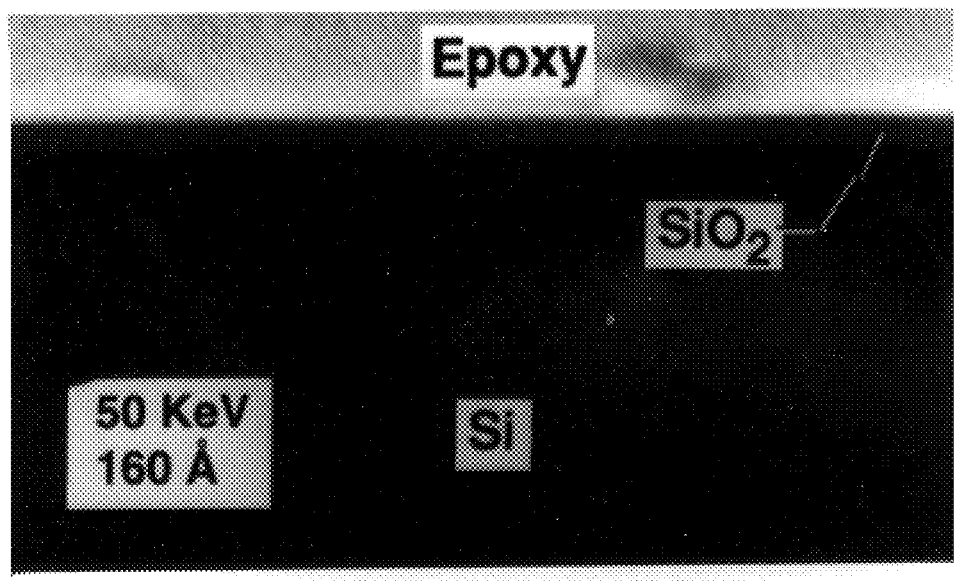

Gate oxide 22 is subsequently grown on epitaxial silicon layer 10 as shown in FIG. 7. Gate oxide 22 can be grown on epitaxial silicon layer 10 by any suitable growth technique. Typically, gate oxide layer 22 is grown on epitaxial silicon layer 10 by heating the substrate to a temperature ranging from about 600 to about 1200° C., preferably from about 700 to about 900° C., and subjecting the substrate to oxidation, such as wet or dry $O_2$. Following oxidation, as depicted in FIG. 7, gate oxide 22 grown on amorphized region 20 of epitaxial silicon layer 10 will be thicker than gate oxide layer 22 grown on non-amorphized regions of epitaxial silicon layer 10. In an alternative embodiment, gate oxide 22 can be selectively grown on amorphized region 20 and/or non-amorphized regions of epitaxial silicon layer 10 utilizing techniques which are well known in the art, e.g., by masking and etching to provide windows exposing the regions where gate oxide is to be selectively grown.

FIG. 8 discussed below demonstrates that the thickness of gate oxide grown on a region which has been amorphized as disclosed herein is a function of the energy of the amorphizing implant. In general, the thicknesses of gate oxides grown on amorphized regions will broadly range from about 40 to about 500 Å, preferably from about 100 to about 160 Å. The thicknesses of gate oxides grown on non-amorphized regions will broadly range from about 20 to about 400 Å, preferably from about 80 to about 130 Å. Thus, gate oxides of varying thicknesses are formed on a semiconductor substrate utilizing the process described herein.

FIG. 8 shows transmission electron micrographs (TEMs) of cross-sections of epitaxial silicon layers having oxide (SiO2) layers grown on the surfaces thereof. FIG. 8(*a*) is a TEM of a cross-section of a 130 Å-thick oxide layer grown on a non-amorphized epitaxial silicon layer (control).

FIGS. 8(*b*)–(*e*) are TEMs of cross-sections of oxide layers grown on epitaxial silicon layers which have been amorphized. The epitaxial silicon layers shown in FIGS. 8(*b*)–(*e*) (designated "Si" in the TEMs) were each implanted with silicon at a dose of $5\times10^{15}$ $Si/cm^2$ using ion mixing implantation. The energies used to implant the Si ions in each of the epitaxial silicon layers of FIGS. 8(*b*)–(*e*) was 15 KeV, 20 KeV, 30 KeV and 50 KeV, respectively. A 140 Å-thick oxide layer grew on the epitaxial silicon layer of FIG. 8(*b*) and 160 Å-thick oxide layers grew on the epitaxial layers of FIGS. 8(*c*)–(*e*). These data show that oxides will grow differentially thicker on amorphized regions relative to non-amorphized regions of an epitaxial silicon layer.

Various MOS devices, e.g., n-MOS, p-MOS and CMOS devices, can be formed on the variable thickness gate oxides in accordance with known procedures. Thus, e.g., polysilicon can be deposited on the gate oxides to form gate stacks and dopant species can be introduced into the semiconductor layer by diffusion or ion implantation to create source and drain regions on both sides of the gate stacks. As the dopant species is introduced, the gate stacks serve as self-aligned masks shielding the channels under the gates from the dopant species. In a particularly preferred embodiment herein, devices operating at both 5V and within the range of from about 1.8 to about 3.3V are fabricated on the variable thickness gate oxides produced in accordance with the process of this invention.

While the invention has been particularly shown and described with reference to these various embodiments, it will be recognized by those skilled in the art that modifications and changes may be made to the present invention without departing from the spirit and scope thereof, which is set forth in the following claims.

What is claimed is:

1. A process for fabricating an integrated circuit comprising the steps of:

(a) growing a semiconductor layer on a substrate;

(b) forming an oxide layer upon the semiconductor layer;

(c) amorphizing a selected area of the semiconductor layer to form an amorphized underlayer;

(d) removing the oxide layer to expose the semiconductor layer having both amorphized and non-amorphized regions;

(e) simultaneously growing gate oxide on the amorphized and non-amorphized regions of the semiconductor layer, including growing gate oxide on the amorphized underlayer, wherein the amorphized underlayer causes a differential in thickness in the gate oxide for forming the gate oxide of a first thickness on the non-amorphized region and of a second thickness greater than the first thickness on the amorphized region of the semiconductor layer to provide regions of the semiconductor layer adapted for different operating voltages.

2. The process of claim 1 wherein the substrate is a silicon wafer.

3. The process of claim 1 wherein the semiconductor layer is epitaxial silicon, polycrystalline silicon or silicon-germanium.

4. The process of claim 1 further comprising, prior to forming the oxide layer, the steps of growing and removing a sacrificial thermal oxide on the semiconductor layer to remove defects from the surface of the semiconductor layer.

5. The process of claim 1 wherein the semiconductor layer is provided with a plurality of device tubs prior to growing the oxide layer.

6. The process of claim 1 wherein the oxide layer is formed on the substrate by heating the substrate to a temperature ranging from about 600° C. to about 1200° C. and oxidizing the substrate.

7. The process of claim 1 wherein the oxide layer possesses a thickness which ranges from about 60 to about 500 Å.

8. The process of claim 1 wherein the oxide layer possesses a thickness which ranges from about 80 to about 200 Å.

9. The process of claim 1 wherein the step of amorphizing the selected area of the semiconductor layer is carried out by depositing a masking layer on the oxide layer and patterning the masking layer to provide a window which exposes the selected area of the oxide layer and thereafter implanting ions in the semiconductor layer underlying the exposed oxide layer.

10. The process of claim 9 wherein the ions are selected from the group consisting of silicon, fluorine, arsenic and mixtures thereof.

11. The process of claim 9 wherein the ions are implanted via ion mixing implantation.

12. The process of claim 9 wherein the ions are implanted at a dose ranging from about $1 \times 10^{12}$ to about $5 \times 10^{16}$ ions per $cm^2$.

13. The process of claim 9 wherein the ions are implanted at a dose ranging from about $1 \times 10^{15}$ to about $5 \times 10^{15}$ ions per $cm^2$.

14. The process of claim 9 wherein the ions are implanted at an energy ranging from about 5 to about 500 keV.

15. The process of claim 9 wherein the ions are implanted at an energy ranging from about 20 to about 50 keV.

16. The process of claim 1 wherein the oxide layer is annealed prior to being removed.

17. The process of claim 1 wherein the gate oxide is grown on the amorphized and non-amorphized regions of the semiconductor layer by heating the substrate to a temperature ranging from about 600° C. to about 1200° C. and oxidizing the substrate.

18. The process of claim 1 wherein the gate oxide grown on the amorphized regions of the semiconductor layer possesses a thickness which ranges from about 40 to about 500 Å.

19. The process of claim 1 wherein the gate oxide grown on the amorphized regions of the semiconductor layer possesses a thickness which ranges from about 100 to about 160 Å.

20. The process of claim 1 wherein the gate oxide grown on the non-amorphized regions of the semiconductor layer possesses a thickness which ranges from about 20 to about 400 Å.

21. The process of claim 1 wherein the gate oxide grown on the non-amorphized regions of the semiconductor layer possesses a thickness which ranges from about 80 to about 130 Å.

22. The process of claim 1 further comprising the step of:

(f) fabricating devices on the gate oxides of different thicknesses for operation with a plurality of different operating voltages.

23. The process of claim 22 wherein the devices are selected from the group consisting of dual voltage, mixed signal, pure analog and digital devices.

24. The process of claim 22 wherein the devices are MOS devices.

25. The process of claim 22 wherein at least one device operates at a voltage which ranges from about 1.8 to about 3.3 V and at least one device operates at a voltage of about 5 V.

* * * * *